US010478899B2

(12) United States Patent
Tai et al.

(10) Patent No.: US 10,478,899 B2
(45) Date of Patent: Nov. 19, 2019

(54) METHOD OF MAKING A TRANSPARENT CONDUCTIVE COMPOSITE MATERIAL

(71) Applicant: NATIONAL TSING HUA UNIVERSITY, Hsinchu (TW)

(72) Inventors: Nyan-Hwa Tai, Hsinchu (TW); Yi-Ting Lai, Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/596,636

(22) Filed: May 16, 2017

(65) Prior Publication Data

US 2017/0246691 A1    Aug. 31, 2017

Related U.S. Application Data

(62) Division of application No. 14/473,595, filed on Aug. 29, 2014, now abandoned.

(30) Foreign Application Priority Data

Jun. 11, 2014    (TW) .............................. 103120205 A

(51) Int. Cl.
    C01B 32/182    (2017.01)
    C01B 32/184    (2017.01)
    (Continued)

(52) U.S. Cl.
    CPC .............. B22F 9/24 (2013.01); B22F 1/0025 (2013.01); B22F 1/02 (2013.01); B82Y 40/00 (2013.01); C01B 32/182 (2017.08); H01B 1/02 (2013.01); H01B 1/04 (2013.01); H01B 1/08 (2013.01); B22F 2009/245 (2013.01);
    (Continued)

(58) Field of Classification Search
    CPC .... H01B 1/02; H01B 1/04; H01B 1/08; C01B 31/0484; C01B 32/184; C01B 32/194; C01B 32/182; C01B 32/198; B82Y 40/00
    USPC ................. 252/500, 506–509; 427/122, 161; 429/231.8; 977/734, 762
    See application file for complete search history.

(56) References Cited

U.S. PATENT DOCUMENTS

2013/0078449 A1    3/2013 Naito et al.
2014/0291819 A1*  10/2014 Barth ............... H01L 23/53276
                                                    257/659

FOREIGN PATENT DOCUMENTS

KR    20130104867 A   *  9/2013  ............... H01B 1/02
KR    1020130104867    *  9/2013  ............... H01B 1/18

OTHER PUBLICATIONS

Wu "Multifunctional Heterostructures Comprised of Carbon and Metal Nanostructures: Growth Mechanism and Applications." Dissertation Thesis, Univ of Alabama, Proquest publishing. (Year: 2013).*

(Continued)

Primary Examiner — Tri V Nguyen
(74) Attorney, Agent, or Firm — Birch, Stewart, Kolasch & Birch, LLP

(57) ABSTRACT

A method of making a transparent conductive material includes: preparing a reactive solution that contains a solvent, a metal salt which is dissolved in the solvent, and a powder of graphene oxide which is dispersed in the solvent; and simultaneously reducing metal ions of the metal salt and the graphene oxide in the reactive solution to form a plurality of core-shell nanowires, each of which includes a core of a metal reduced from the metal ions, and a shell of graphene surrounding the core.

9 Claims, 11 Drawing Sheets

(51) Int. Cl.
| | |
|---|---|
| *C01B 32/198* | (2017.01) |
| *B82Y 40/00* | (2011.01) |
| *B22F 9/24* | (2006.01) |
| *H01B 1/08* | (2006.01) |
| *H01B 1/04* | (2006.01) |
| *H01B 1/02* | (2006.01) |
| *B22F 1/00* | (2006.01) |
| *B22F 1/02* | (2006.01) |

(52) U.S. Cl.
CPC ..... *B22F 2301/255* (2013.01); *B22F 2302/40* (2013.01); *B22F 2304/05* (2013.01); *B22F 2998/10* (2013.01); *Y10T 428/249921* (2015.04)

(56) References Cited

OTHER PUBLICATIONS

Rathmell "Metal Nanowires: Synthesis, Processing, and Structure-Property Relationships in the Context of Flexible Transparent Conducting Films." Dissertation, Duke Univ, Proquest publishing (Year: 2013).*

Jiu "Synthesis and application of Ag nanowires via a trace salt assisted hydrothermal process." J Nanopart Res (2012) 14:975 (Year: 2012).*

Jiu "Synthesis and application of Ag nanowires via a trace salt assisted hydrothermal process." J Nanopart Res (2012) 14:975 (Year: 2012) (Year: 2012).*

Jiu "Ag nanowires: large-scale synthesis via a trace-salt-assisted solvothermal process and application in transparent electrodes." J Nanopart Res (2013) 15:1588. (Year: 2013).*

Zhang "Large-size graphene microsheets as a protective layer for transparent conductive silver nanowire film heaters." Carbon 69, pp. 437-443, pub online Dec. 19, 2013. (Year: 2013).*

Hecht ("Emerging Transparent Electrodes Based on Thin Films of Carbon Nanotubes, Graphene, and Metallic Nanostructures." Adv Mat, 23, pp. 1482-1513, pub Feb. 15, 2011).

Robinson ("Properties of Fluorinated Graphene Films." Nanoletters, 10, pp. 3001-3005, pub Jul. 16, 2010).

Yu ("From Starch to Metal/Carbon Hybrid Nanostructures: Hydrothermal Metal-Catalyzed Carbonization." Adv Mat, 16(18), pp. 1636-1640, Sep. 2004).

* cited by examiner

METHOD OF MAKING A TRANSPARENT CONDUCTIVE COMPOSITE MATERIAL

CROSS-REFERENCE TO RELATED APPLICATION

This application is a Divisional of copending U.S. application Ser. No. 14/473,595, filed on Aug. 29, 2014, which claims priority under 35 U.S.C. § 119(a) to Application No. 103120205, filed in Taiwan on Jun. 11, 2014, all of which are hereby expressly incorporated by reference into the present application.

FIELD OF THE INVENTION

This invention relates to a method of making a transparent conductive material, and more particularly to a method including simultaneously reducing metal ions and graphene oxide in a solution for making a transparent conductive material.

BACKGROUND OF THE INVENTION

U.S. Patent Application Publication No. 2013/0299217 discloses a conductive thin film that includes a one-dimensional nanomaterial networked layer and a coating layer of graphene or graphene oxide formed on the one-dimensional nanomaterial networked layer so as to form a double-layered structure. The one-dimensional nanomaterial networked layer includes a plurality of metal nanowires, such as silver nanowires, gold nanowires, copper nanowires, or a plurality of metal oxide nanowires, such as zinc oxide nanowires and titanium oxide nanowires.

U.S. Patent Application Publication No. 2013/0299217 discloses a hybrid transparent conducting material that includes a granular polycrystalline film of graphene and a plurality of metallic nanowires that are randomly dispersed on the polycrystalline film.

In "Co-percolating graphene-wrapped silver nanowire network for high performance, highly stable, transparent conducting electrodes", Advance Functional Material, Vol. 23, P5150-5158 (2013), Ruiyi Chen et al. disclose a conductive material that includes a single layer graphene and a network of silver nanowires formed on the single layer graphene using percolating transport theory. The conductive material has a sheet resistance of about 22 ohms per square, and a transparency of about 88%.

In "Transparent conducting film composed of graphene and silver nanowire stacked layers", Synthetic Metals. 175: 42-46, (2013), Katsuyuki Naito et al. disclose a transparent conducting film that has a silver nanowire coating layer and a graphene coating layer, which are coated and stacked one above the other. The transparent conducting film has a sheet resistance of about 4 ohms per square, and a transparency of about 75%.

In "Highly stable and flexible silver nanowire-graphene hybrid transparent conductive electrodes for emerging optoelectronic devices", Nanoscale, Issue 17, 5, 7750-7755 (2013), Donghwa Lee et al. disclose a transparent conducting material that has a silver nanowire layer and a graphene layer formed on the silver nanowire layer through chemical vapor deposition techniques. The transparent conducting material has a sheet resistance of about 34.4 ohms per square, and a transparency of about 92.8%.

U.S. Pat. No. 8,466,366 discloses a transparent conductor that includes a film of a conductive ceramic and additives that are at least partially incorporated into the film of the conductive ceramic. The incorporation may be carried out by mixing a fluid or slurry of the conductive ceramic with a fluid or slurry of the additives. The additives may include conductive materials, such as nanoparticles, nanowires, nanotubes, core-shell nanowires, and graphene. Since the nanowires and graphene have a relatively poor dispersibility, they tend to aggregate in the fluid of the additives and also in a mixture of the fluid of the additives and the fluid of the conductive ceramic, which adversely affects the conductivity and transparency of the transparent conductor thus formed.

SUMMARY OF THE INVENTION

Therefore, an object of the present invention is to provide a method of making a transparent conductive material that may overcome the aforesaid drawback associated with the prior art.

According to one aspect of this invention, there is provided a method of making a transparent conductive material that comprises: preparing a reactive solution that contains a first solvent, a metal salt which is dissolved in the first solvent, and a powder of graphene oxide which is dispersed in the first solvent; and simultaneously reducing metal ions of the metal salt and the graphene oxide in the reactive solution to form a plurality of core-shell nanowires, each of which includes a core of a metal reduced from the metal ions, and a shell of graphene surrounding the core.

According to another aspect of this invention, there is provided a transparent conductive material that comprises a plurality of core-shell nanowires and a plurality of nanowebs of graphene. The core-shell nanowires randomly cross one another. Each of the core-shell nanowires includes a core of a metal and a shell of graphene surrounding the core. The nanowebs randomly extend from the shells of the core-shell nanowires to interconnect the core-shell nanowires to form a network structure.

BRIEF DESCRIPTION OF THE DRAWINGS

In drawings which illustrate an embodiment of the invention.

DETAILED DESCRIPTION OF THE EMBODIMENT

Figure 1A:
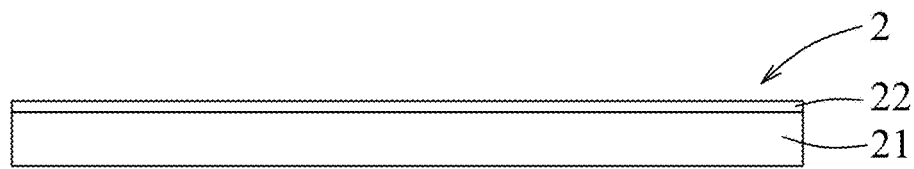
FIG. 1A is a schematic view of an embodiment of a transparent conductive panel according to the present invention.
Figure 1B:
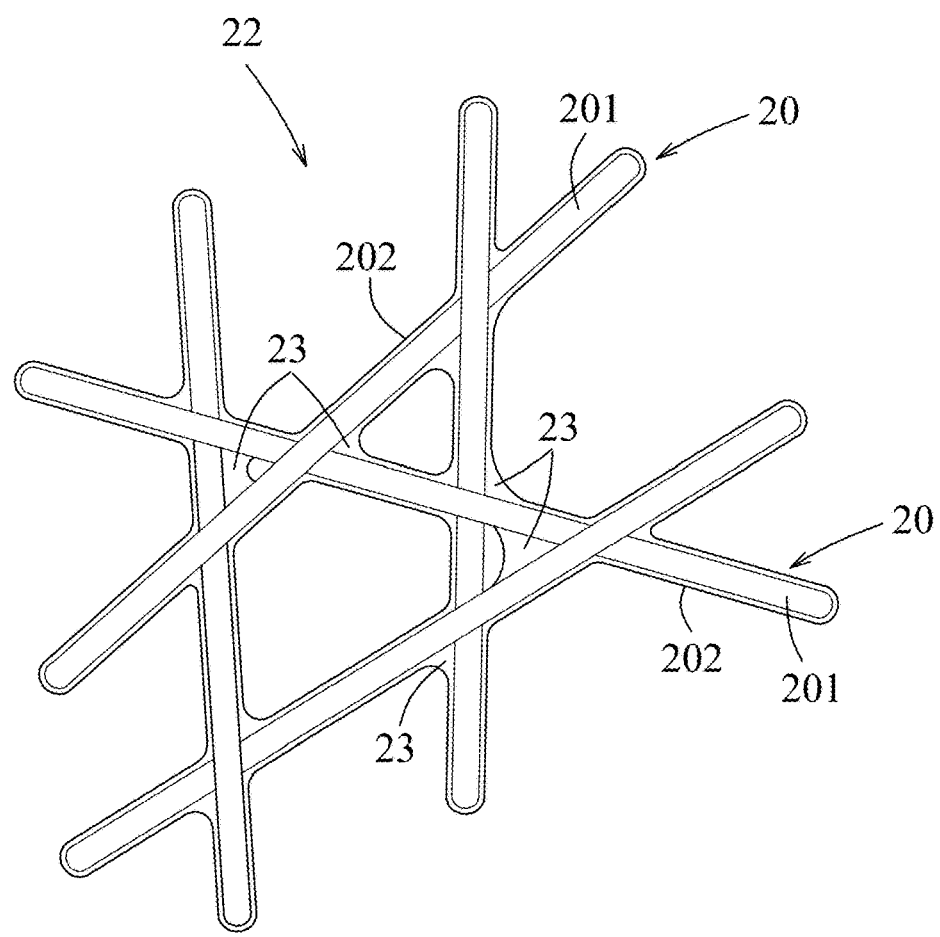
FIG. 1B is a schematic view of a transparent conductive material of the embodiment.

FIGS. 1A and 1B illustrate the embodiment of a transparent conductive panel according to the present invention. The transparent conductive panel 2 includes a transparent substrate 21 and a conductive coating layer 22 of a transparent conductive material.

Preferably, the transparent substrate 21 is made from a polymer selected from the group consisting of polyethylene terephthalate (PET), polyethylene naphthalate, and polycarbonate.

Preferably, the transparent substrate 21 is subjected to oxygen plasma surface treatment for enhancing the bonding between the transparent substrate 21 and the conductive coating layer 22.

The transparent conductive material includes a plurality of core-shell nanowires 20 and a plurality of nanowebs 23 of graphene. The core-shell nanowires 20 randomly cross one another. Each of the core-shell nanowires 20 includes a core 201 of a metal, and a shell 202 of graphene surrounding the core 201. The nanowebs 23 randomly extend from the shells 202 of the core-shell nanowires 20 to interconnect the core-shell nanowires 20 to form a network structure.

Preferably, the transparent conductive material has a sheet resistance not greater than 100 ohms per square, and a transparency not smaller than 90% with respect to a wavelength of 550 nm. More preferably, the transparent conductive material has a sheet resistance not greater than 30 ohms per square.

Preferably, the metal of the core 201 is silver.

Preferably, the graphene is p-type doped reduced graphene, and more preferably, the graphene is doped with halide ions.

An embodiment of the method of making the transparent conductive material includes the steps of: preparing a reactive solution that contains a first solvent, a metal salt which is dissolved in the first solvent, and a powder of graphene oxide which is dispersed in the first solvent; and simultaneously reducing metal ions of the metal salt and the graphene oxide in the reactive solution into reduced metal nanowires and reduced graphene, respectively, under a condition that permits growth of the reduced graphene on the reduced metal nanowires and wrapping of the reduced graphene around the reduced metal nanowires to form the nanowebs and the core-shell nanowires (the reduced metal nanowire and the reduced graphene wrapping the metal nanowire define the core 201 and the shell 202, respectively).

Preferably, the first solvent is a reducing agent that is reactive with the metal ions and the graphene oxide for reducing the metal ions and the graphene oxide.

Preferably, the first solvent is polyhydroxy alcohol, and more preferably, the polyhydroxy alcohol is selected from the group consisting of ethylene glycol, propylene glycol, butylene glycol, neopentyl glycol, glycerin, and combinations thereof.

Preferably, the metal salt is selected from the group consisting of silver nitrate, silver perchlorate, and silver fluoride.

Preferably, the reactive solution is heated to a temperature not smaller than 150° C. and less than the boiling point of the first solvent during simultaneous reduction of the metal ions and the graphene oxide. It is noted that silver ions can be effectively reduced in ethylene glycol under a temperature ranging from 150° C. to 180° C.

The reactive solution further contains a templating reagent that is selected from the group consisting of polyvinylpyrrolidone (PVP), polyvinyl alcohol, poly(dimethylsiloxane), poly(oxyethylene), and combinations thereof, and a buffer agent that is selected from the group consisting of a metal halide, a metal sulfide, and a metal nitrate. Preferably, the metal halide is silver bromide, potassium bromide (KBr), or silver chloride (AgCl).

In this embodiment, preparation of the reactive solution is conducted by adding a graphene oxide-containing solution, that contains the graphene oxide, into a precursor solution that contains the metal salt, the templating reagent, the buffer agent and the first solvent while maintaining the precursor solution at an elevated temperature not smaller than 150° C.

Preferably, a portion of the metal ions in the precursor solution is reduced under the elevated temperature to form a plurality of nanowire seeds prior to the addition of the graphene oxide-containing solution into the precursor solution so as to facilitate subsequent simultaneous growth of the nanowire seeds in length into the reduced metal nanowires and growth of the reduced graphene on the nanowire seeds in the reactive solution.

The templating reagent functions to bind preferentially to a specific crystal face of the nanowire seeds so as to yield preferential growth of the nanowire seeds along a specific direction. The buffer agent functions to slowdown the reducing rate to avoid the nanowire seeds from growing into nanoparticles.

It is noted that the presence of halide ions of the metal halide of the buffer agent in the reactive solution can result in p-typed doping of the reduced graphene, which results in formation of the halide doped reduced graphene, which, in turn, results in generation of positive charges in the reduced graphene. The reduced metal nanowires formed in the reactive solution carry negative charges due to the binding of the templating reagent thereon during reduction of the metal ions in the reactive solution. As a consequence, the halide doped reduced graphene and the negatively charged metal nanowires are attracted to each other through electrostatic interaction, which facilitates wrapping of the halide doped reduced graphene around the negatively charged metal nanowires and which enhances the bonding strength between the halide doped reduced graphene and the negatively charged metal nanowires.

The graphene oxide-containing solution is prepared by adding the powder of graphene oxide into a second solvent to result in a mixture, followed by subjecting the mixture to ultrasonication to disperse and exfoliate the powder of graphene oxide in the second solvent and to filtration for removing unexfoliated graphene oxide. It is noted that graphene oxide has a better dispersibility than that of graphene in a solvent.

Preferably, the second solvent is miscible with the first solvent, and is also a reducing agent that is reactive with the metal ions and the graphene oxide for reducing the metal ions and the graphene oxide.

Preferably, the second solvent is selected from the group consisting of ethylene glycol, propylene glycol, butylene glycol, neopentyl glycol, glycerin, and combinations thereof.

The following example and comparative example are provided to illustrate the embodiment of the invention, and should not be construed as limiting the scope of the invention.

Example 1

0.2 g PVP (templating reagent) and 0.005 g KBr were dissolved in 15 ml ethylene glycol (serving as a solvent and a reducing agent) in a reactor to form a first mixture. The first mixture was heated to about 160° C. 0.025 g AgCl was dispersed in 5 ml ethylene glycol to form a second mixture. The second mixture was slowly added into the first mixture to form a first solution. The first solution was maintained at about 160° C. 0.2 g AgNO3 was dissolved in 15 ml ethylene glycol to form a second solution. The second solution was slowly added into the first solution to form a precursor solution and to allow reduction of Ag ions into Ag nanowire seeds to take place for one hour. A powder of graphene oxide was added into ethylene glycol to form a graphene oxide-containing mixture having a concentration of 1 mg graphene oxide per 1 ml ethylene glycol. The graphene oxide-containing mixture was subjected to ultrasonication and filtration for 4 hours so as to obtain a uniform graphene oxide-containing solution. 5 mg of the uniform graphene oxide-containing solution was added into the precursor solution, which was maintained at about 160° C., to form a reactive solution and to allow simultaneous reduction of the Ag ions and graphene oxide to take place in the reactive solution. The reduction operation lasted for 48 hours under about 160° C. The reactive solution was then cooled and subjected to filtration to obtain the transparent conductive material, followed by washing the transparent conductive material with deionized water. The transparent conductive material thus formed has a sheet resistance of about 25 ohms per square, and a transparency of about 94.68% with respect to a wavelength of 550 nm.

The transparent conductive material thus formed was mixed with methanol to form a sol gel. The sol gel was applied to a PET substrate, followed by drying to remove methanol from the sol gel so as to form a conductive coating layer of the transparent conductive material on the PET substrate. The conductive coating layer and the PET substrate cooperatively define the transparent conductive panel.

Figure 2:
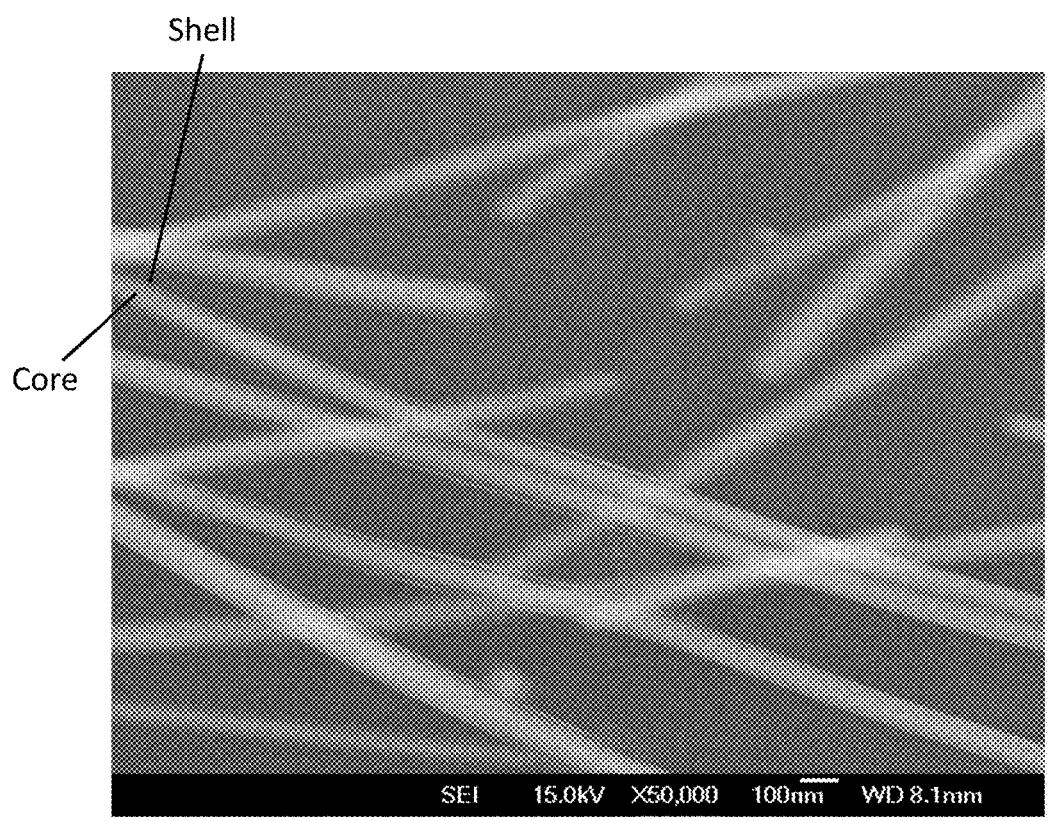
FIG. 2 is an SEM diagram of the transparent conductive material of Example 1.
Figure 3:
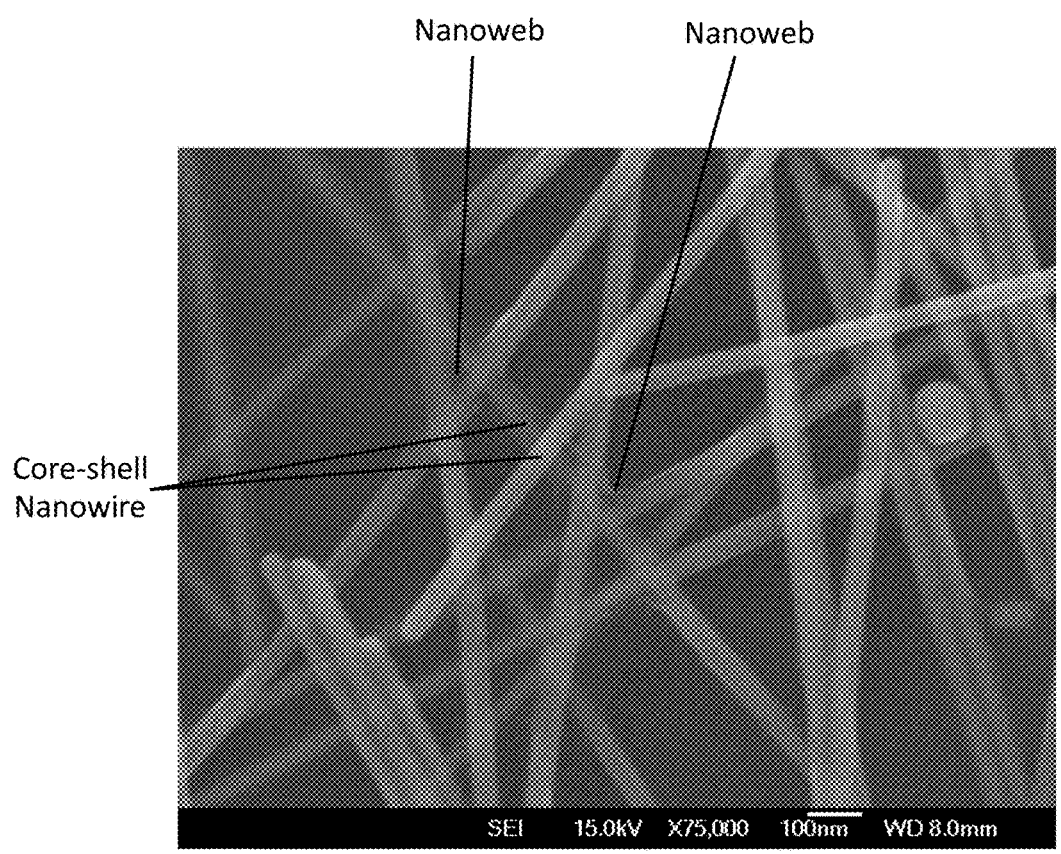
FIG. 3 is another SEM diagram of the transparent conductive material of Example 1.

FIGS. 2 and 3 are SEM pictures of the transparent conductive material of Example 1. The SEM pictures show that the transparent conductive material includes a plurality of the core-shell nanowires and a plurality of the nanowebs of graphene. The nanowebs are randomly formed at intersections of the core-shell nanowires.

Comparative Example

The procedures and operating conditions of preparing the transparent conductive material of Comparative Example were similar to those of Example 1, except that graphene and/or graphene oxide was not added into the reactive solution.

The transparent conductive material of Comparative Example thus formed has a sheet resistance of about 40.25 ohms per square, and a transparency of about 93.48% with respect to a wavelength of 550 nm.

The transparent conductive material thus formed was mixed with methanol to form a sol gel. The sol gel was applied to a PET substrate, followed by drying to remove methanol from the sol gel so as to form the transparent conductive panel of Comparative Example.

Performance Test

Figure 4:
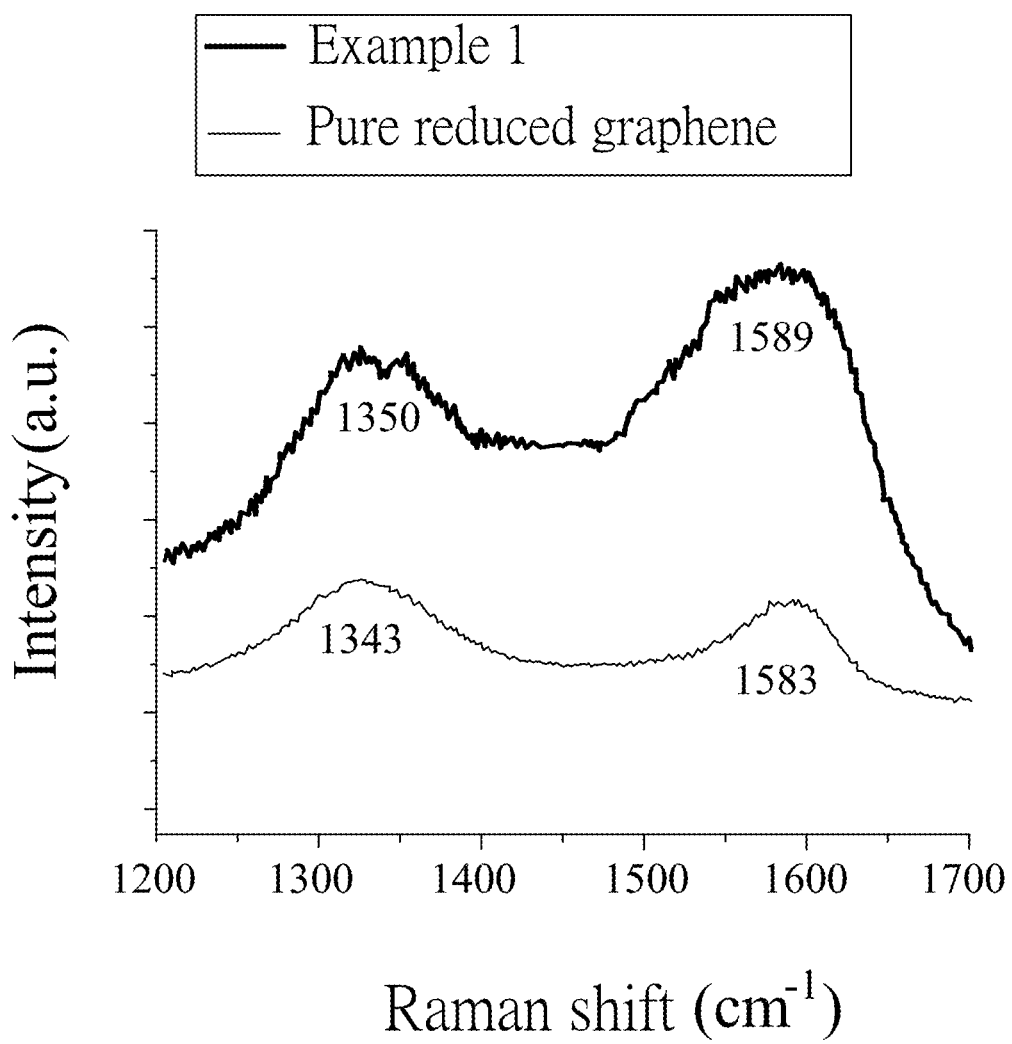
FIG. 4 is a Raman spectra diagram for a pure reduced graphene and a reduced ion-doped graphene of Example 1.

FIG. 4 is a Raman spectrum diagram for a pure reduced graphene spectrum and the reduced ion-doped graphene spectrum of Example 1. The pure reduced graphene spectrum has a G-mode characteristic peak at 1583 cm$^{-1}$, while the reduced ion-doped graphene spectrum has a G-mode characteristic peak at 1589 cm$^{-1}$. The shifting of the G-mode characteristic peak from 1583 cm$^{-1}$ to 1589 cm$^{-1}$ indicates that the reduced graphene of Example 1 is doped with ions in the reactive solution during reduction thereof.

Figure 5:
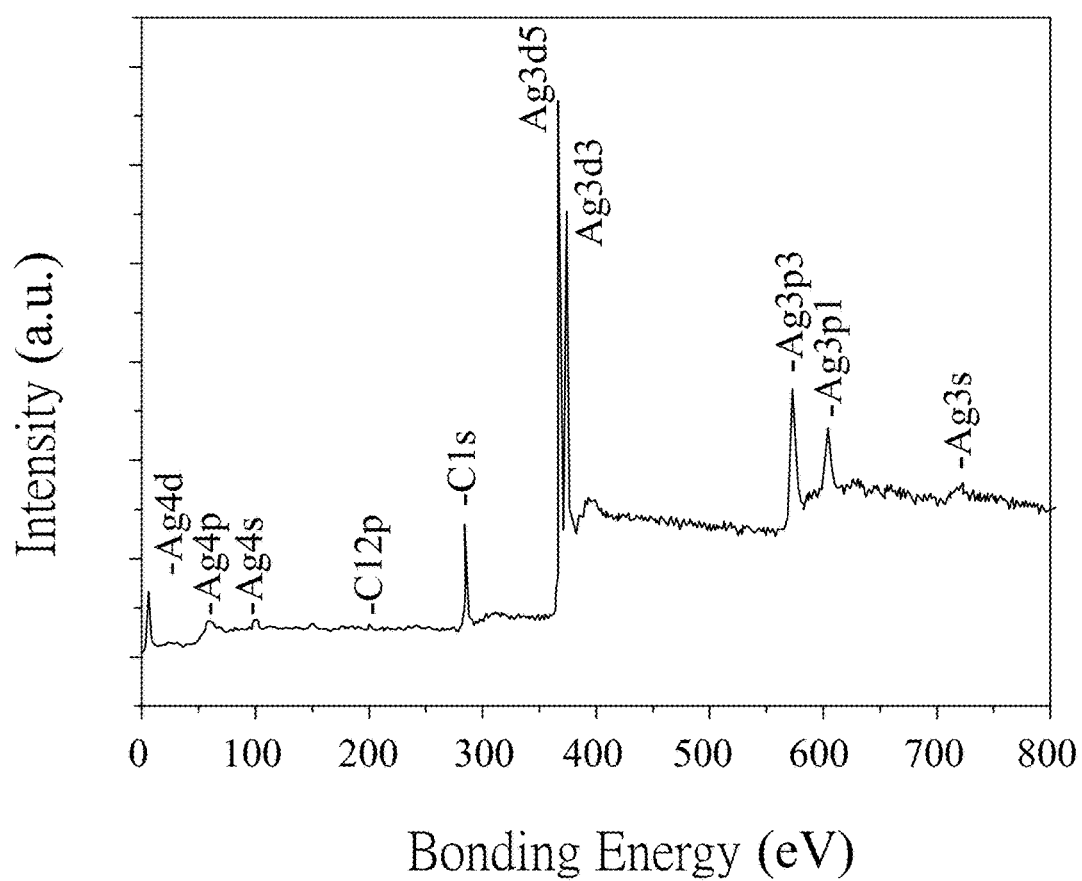
FIG. 5 is an XPS diagram showing bonding energies of various elements of the transparent conductive material of Example 1.
Figure 6:
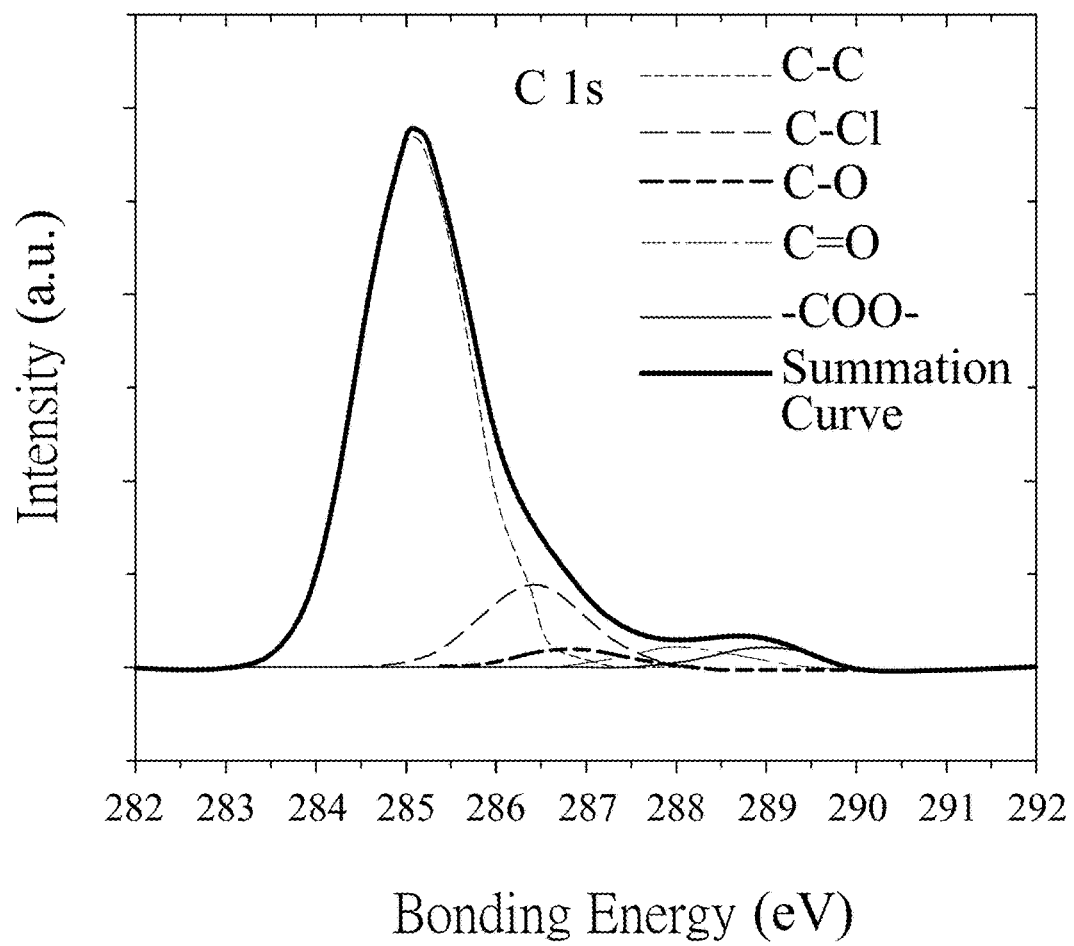
FIG. 6 is an enlarged XPS diagram of FIG. 5 showing the bonding energy of C 1s spectra.
Figure 7:
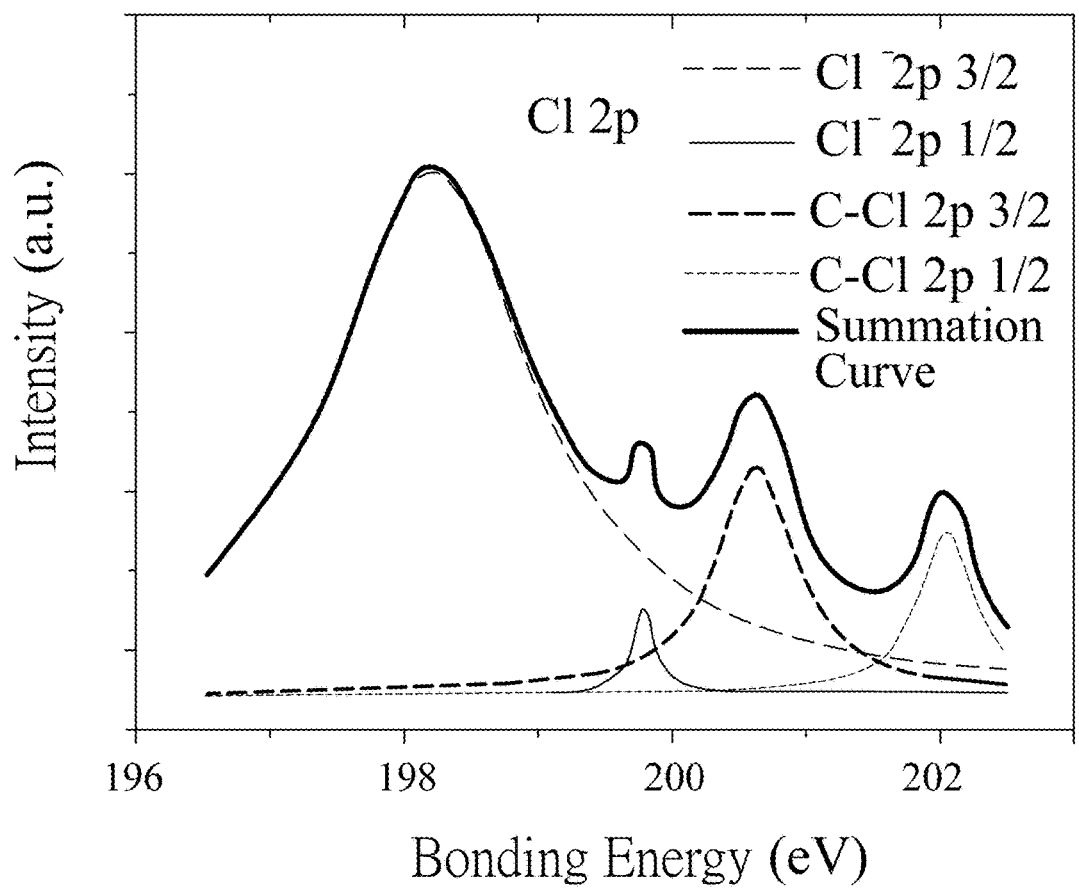
FIG. 7 is an enlarged XPS diagram of FIG. 5 showing the bonding energy of Cl 2p spectra.

FIG. 5 is an XPS (x-ray photoelectron spectroscopy) diagram spanning a range of bonding energy from zero to 800 eV to show bonding energies of various elements of the transparent conductive material of Example 1. FIGS. 6 and 7 are enlarged XPS diagrams of FIG. 5 for showing the bonding energies of C is spectra and Cl 2p spectra. The summation curve shown in FIG. 6 is a curve of summation of the bonding energies of C—C, C—Cl, C—O, C=O and —COO—. The summation curve shown in FIG. 7 is a curve of summation of the bonding energies of Cl$^-$ 2p 3/2, Cl$^-$ 2p 1/2, C—Cl 2p 3/2 and C—Cl 2p 1/2. The presence of peaks at 200.5 eV and 202 eV shown in FIG. 7 indicates the presence of C—Cl$^-$ bonding (a covalence bonding between a carbon atom and a chloride ion), i.e., the reduced graphene was doped with the chlorine ions.

Figure 8:
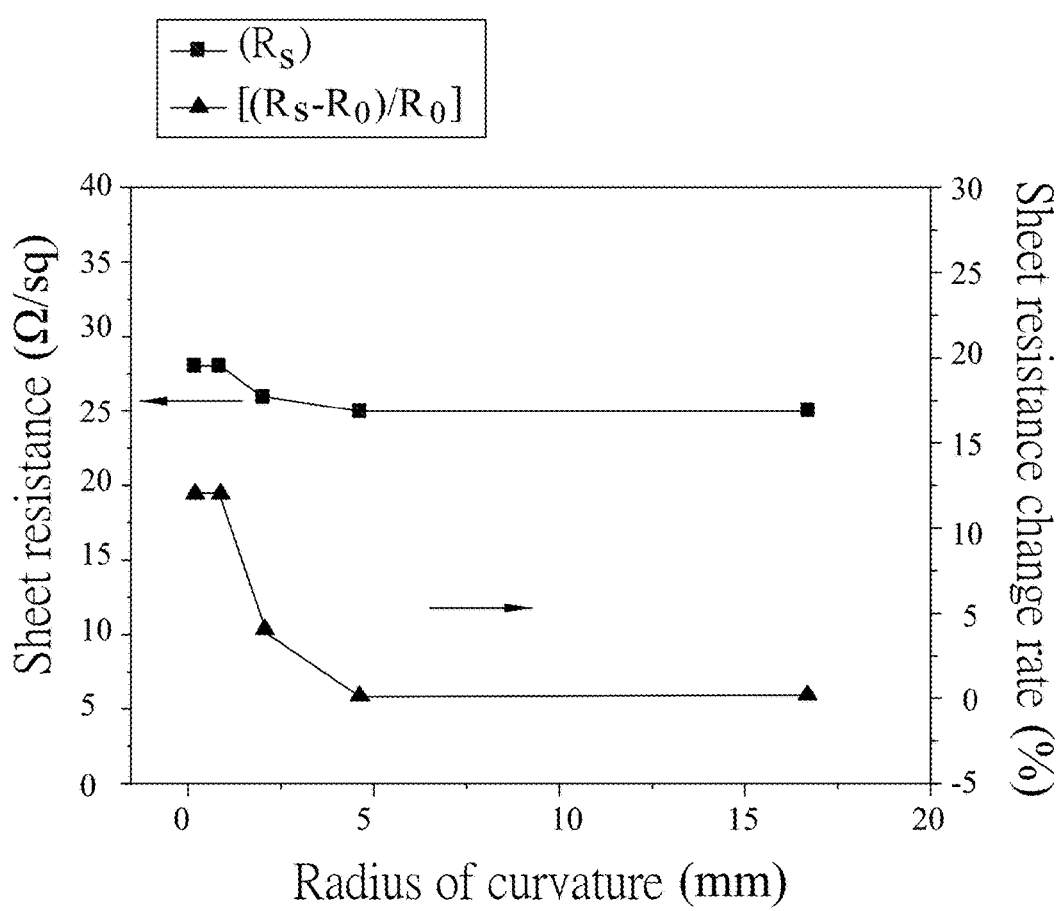
FIG. 8 is a plot of sheet resistance and sheet resistance change rate vs radius of curvature of the transparent conductive material of Example 1.

FIG. 8 is a diagram of sheet resistance ($R_s$) vs radius of curvature, showing the change in the sheet resistance of the transparent conductive material of Example 1 under a bending test. The results show that the sheet resistance of the transparent conductive material of Example 1 only increases from 25 ohms per square to 27.5 ohms per square (or about 10% for the sheet resistance change rate defined by $R_s-R_0/R_0\times100\%$, where $R_0$ is the initial sheet resistance) when the transparent conductive material of Example 1 is bent to a radius of curvature equal to 0.2 mm.

Figure 9:
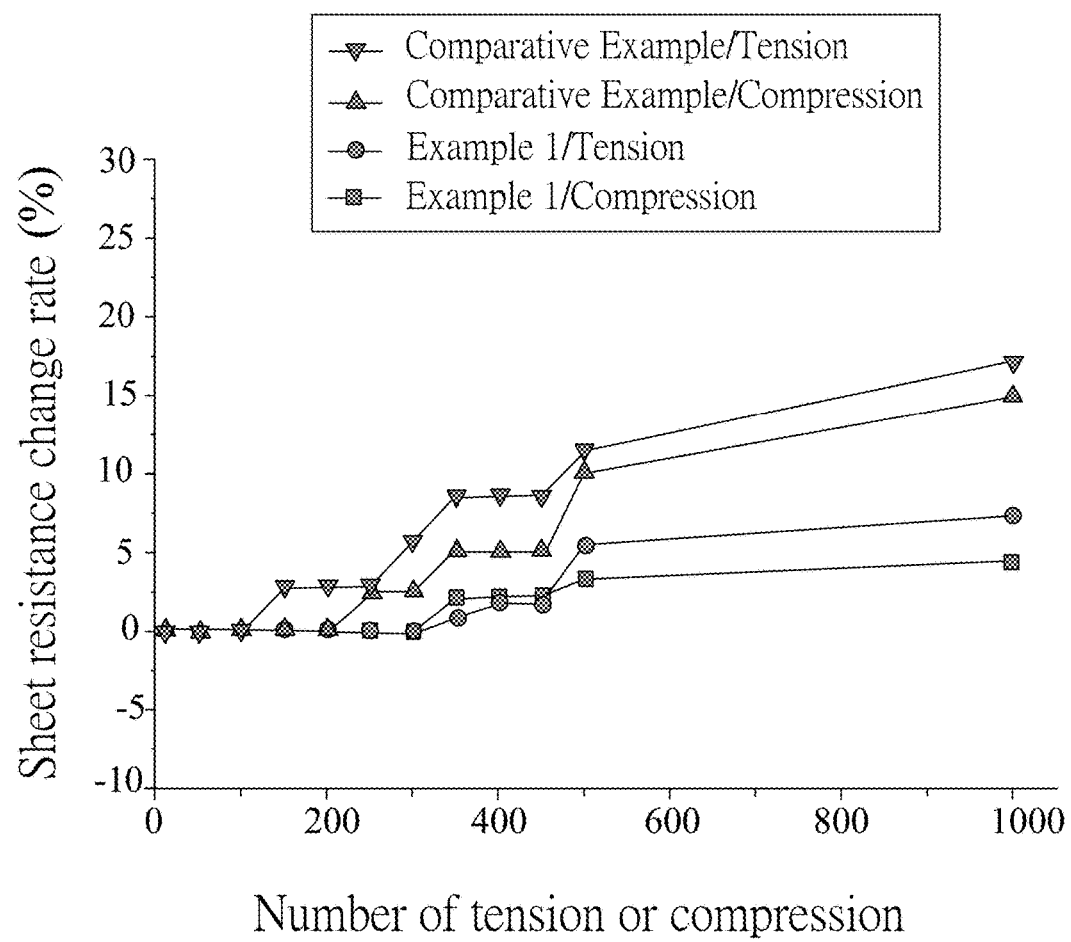
FIG. 9 is a plot of sheet resistance change rate vs number of tension and number of compression for the transparent conductive material of Example 1 and the transparent conductive material of Comparative Example.

FIG. 9 is a diagram of sheet resistance change rate ($R_s-R_0/R_0\times100\%$) vs number of tension and number of compression, showing the change of the sheet resistance for samples of the transparent conductive material of Example 1 and the transparent conductive material of Comparative Example. The number of tension represents the number of the sample being repeatedly tensioned under a predetermined tensile stress. The number of compression represents the number of the sample being repeatedly compressed under a predetermined compression stress. The results show that the gap between the sheet resistance change rates of the transparent conductive material of Comparative Example and the transparent conductive material of Example 1 starts increasing significantly (it is noted that the sheet resistance change rate of the transparent conductive material of Comparative Example is higher than that of the transparent conductive material of Example 1) when the number of tension exceeds 100, and that the gap between the sheet resistance change rates of the transparent conductive material of Comparative Example and the transparent conductive material of Example 1 starts increasing significantly (it is noted that the sheet resistance change rate of the transparent conductive material of Comparative Example is higher than that of the transparent conductive material of Example 1) when the number of compression exceeds 200.

Figure 10:
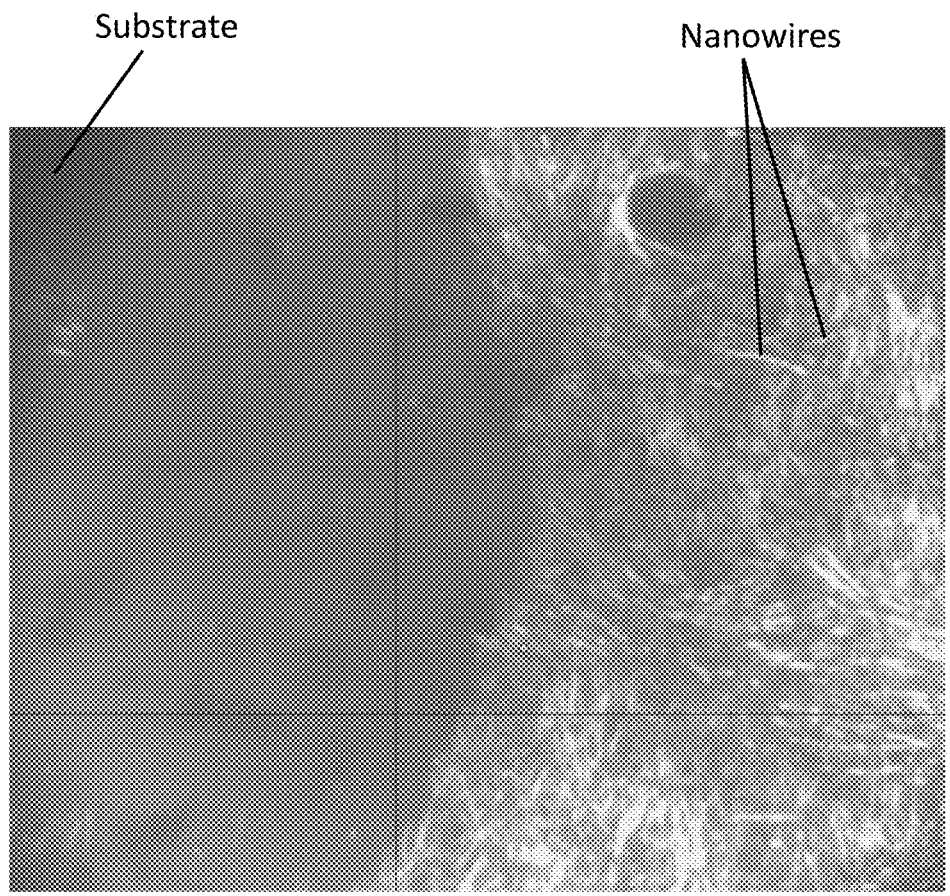
FIG. 10 is an optical microscope image of the transparent conductive material of Comparative Example.
Figure 11:
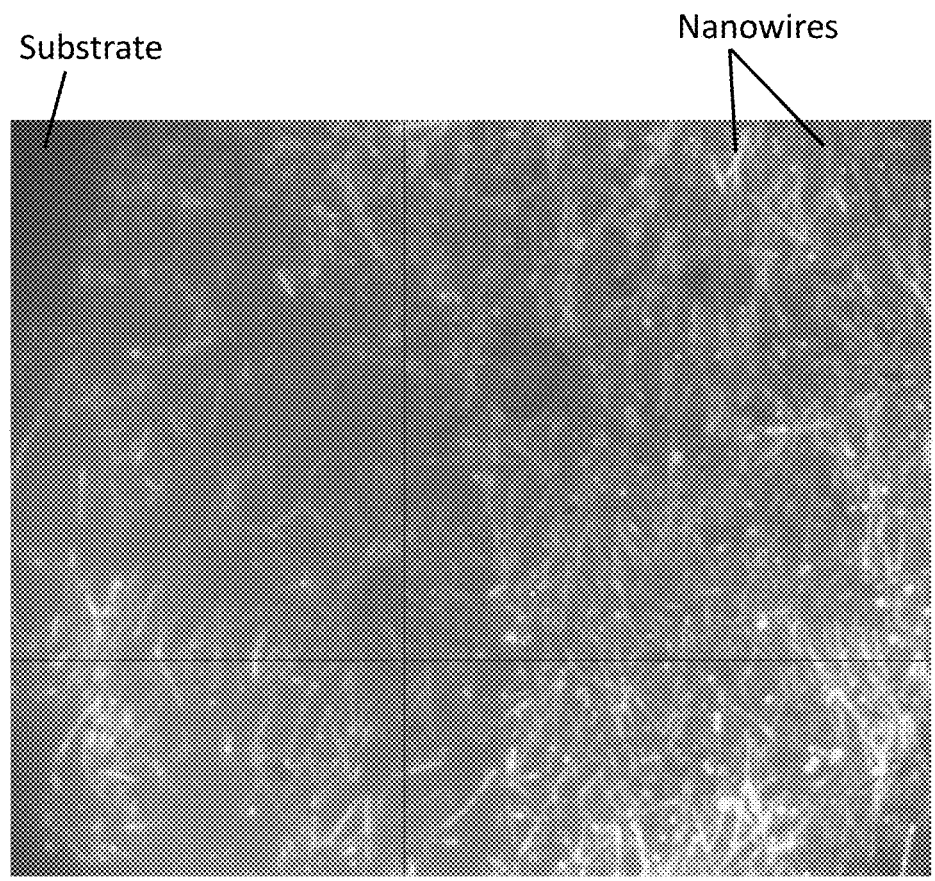
FIG. 11 is an optical microscope image of the transparent conductive material of Example 1.

The transparent conductive panel of Comparative Example and the transparent conductive panel of Example 1 were subjected to a bonding strength test. In the bonding strength test, a 3M adhesive tape was adhesively attached to a left side of the transparent conductive panel, and was subsequently removed therefrom. FIGS. 10 and 11 are respectively optical microscope images showing the change of the transparent conductive material on the transparent substrate of the transparent conductive panel of Comparative Example and the change of the transparent conductive material on the transparent substrate of the transparent conductive panel of Example 1 after the bonding strength test. The results show that a significant amount of the transparent conductive material still remained on the left side of the transparent conductive panel of Example 1 after the bonding strength test and that the transparent conductive material at the left side of the transparent conductive panel of Comparative Example is substantially removed after the bonding strength test.

By simultaneously reducing the metal ions and the graphene oxide and permitting growth of the reduced graphene on the reduced metal nanowires to form the core-shell nanowires in the reactive solution according to the method of this invention, the aforesaid drawback regarding the poor dispersing of graphene in the preparation of the conventional transparent conductive material as encountered in the prior art can be eliminated.

While the present invention has been described in connection with what is considered the most practical embodiment, it is understood that this invention is not limited to the disclosed embodiment but is intended to cover various arrangements included within the spirit and scope of the broadest interpretation and equivalent arrangements.

What is claimed is:

1. A method of making a transparent conductive material, comprising steps of:
   a) preparing a precursor solution that contains a metal salt, a templating reagent, a buffer agent, and a first solvent which also serves as a reducing agent;
   b) preparing a graphene oxide solution by dispersing a graphene oxide in a second solvent which is miscible with the first solvent; and
   c) slowly adding the graphene oxide solution to the precursor solution at an elevated temperature of no smaller than 150° C. and less than 290° C. so as to permit growth of graphene on metal nanowire seeds which are formed as a result of a reduction of the metal salt to thereby obtain a network structure which includes a plurality of core-shell nanowires interconnected to each other and a plurality of nanowebs of graphene extending from the core-shell nanowires.

2. The method of claim 1, wherein the first solvent is a polyhydroxy alcohol.

3. The method of claim 2, wherein the polyhydroxy alcohol is selected from the group consisting of ethylene glycol, propylene glycol, butylene glycol, neopentyl glycol, glycerin, and combinations thereof.

4. The method of claim 1, wherein the metal salt is selected from the group consisting of silver nitrate, silver perchlorate, and silver fluoride.

5. The method of claim 1, wherein the templating reagent is selected from the group consisting of polyvinylpyrrolidone, polyvinyl alcohol, poly(dimethylsiloxane), poly(oxyethylene), and combinations thereof.

6. The method of claim 1, wherein the buffer agent is selected from the group consisting of a metal halide, a metal sulfide, and a metal nitrate.

7. The method of claim 6, wherein the metal halide is silver bromide or silver chloride.

8. The method of claim 1, further comprising, prior to step c), a step of heating the precursor solution up to the elevated temperature to initiate the reduction of a portion of the metal salt to form the metal nanowire seeds.

9. The method of claim 1, wherein the second solvent is selected from the group consisting of ethylene glycol, propylene glycol, butylene glycol, neopentyl glycol, glycerin, and combinations thereof.

* * * * *